(12) United States Patent
Corzine et al.

(10) Patent No.: US 8,472,487 B2
(45) Date of Patent: Jun. 25, 2013

(54) PHOTONIC INTEGRATED CIRCUIT HAVING VARIABLE LENGTH MACH-ZEHNDER MODULATORS

(75) Inventors: Scott Corzine, Sunnyvale, CA (US); Mehrdad Ziari, Pleasanton, CA (US)

(73) Assignee: Infinera Corporation, Sunnyvale, CA (US)

(*) Notice: Subject to any disclaimer, the term of this patent is extended or adjusted under 35 U.S.C. 154(b) by 271 days.

(21) Appl. No.: 12/418,316

(22) Filed: Apr. 3, 2009

(65) Prior Publication Data

US 2010/0254420 A1 Oct. 7, 2010

(51) Int. Cl.
*H01S 3/10* (2006.01)

(52) U.S. Cl.
USPC .......................................................... 372/26

(58) Field of Classification Search
USPC .................................. 372/26, 23, 30
See application file for complete search history.

(56) References Cited

U.S. PATENT DOCUMENTS

| 2002/0089711 A1* | 7/2002 | Conzone et al. | 359/109 |
| 2006/0171723 A1* | 8/2006 | Bigo et al. | 398/188 |
| 2007/0212075 A1* | 9/2007 | Yin | 398/183 |

\* cited by examiner

*Primary Examiner* — Dung Nguyen
(74) *Attorney, Agent, or Firm* — David L. Soltz

(57) ABSTRACT

A photonic integrated circuit (PIC) having multiple Mach-Zehnder (MZ) modulators with different lengths is provided. The modulator lengths are selected to provide optimal performance for each optical path provided on the PIC.

14 Claims, 1 Drawing Sheet

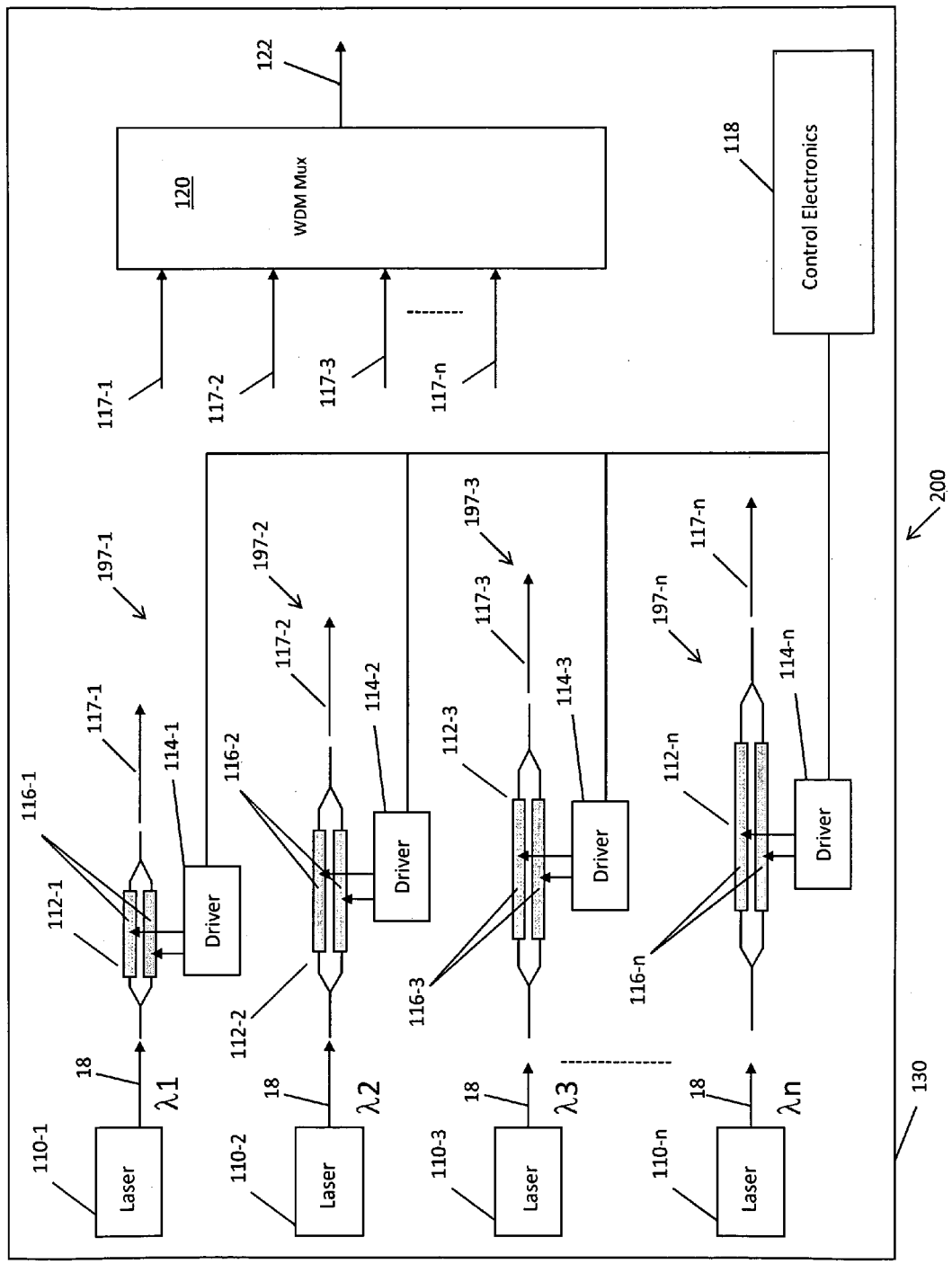

PHOTONIC INTEGRATED CIRCUIT HAVING VARIABLE LENGTH MACH-ZEHNDER MODULATORS

BACKGROUND OF THE INVENTION

Wavelength division multiplexed (WDM) optical communication systems are known which combine multiple modulated signals at different wavelengths onto a single optical fiber. Typically, the MZ modulators in such systems are discrete components which are housed separately from other components, such as lasers and optical combiners. Recently, however, optical components for WDM applications have been integrated onto a common chip or semiconductor substrate. In particular, so-called "photonic integrated circuits" (PICs) have been developed which have multiple optical paths, each of which including a series of optical components. For example, an optical path may include a laser, modulator, optical amplifier, and variable optical attenuator. The optical signals supplied from each optical path may be supplied to an optical combiner, which combines or multiplexes each optical signal onto a common output.

Mach-Zehnder (MZ) modulators are commonly used in optical communication systems in order to modulate an optical signal in accordance with information to be transmitted to a receiver. A Mach-Zehnder modulator typically includes an interferometer having an input waveguide and arms that branch from the input waveguide. An output waveguide is also provided at the junction of the arms. Typically, an optical signal is directed into and propagates in the input waveguide, and is split between the arms so that approximately one-half of the input optical signal propagates in each of the interferometer arms. A modulating signal is applied to an electrode adjacent one or both of the arms in order to change the effective refractive indices in the interferometer arms and to introduce a relative phase shift between the two optical signals. The phase-shifted optical signals combine at the output waveguide and may produce intensity modulated optical signals. Depending on the relative phase shift between the two optical signals, they may interfere either constructively or destructively. The output of the modulator may thus be an intensity modulated optical signal. A relative phase-shift between the optical signals in the arms of approximately $\pi$ is required to switch the output of the modulator between adjacent on and off states, and the modulation voltage required to achieve such a phase shift is referred to as $V_\pi$. The output of the modulator may also be phase modulated, as well.

If multiple modulators are provided on a PIC, $V_\pi$ may vary for each optical signal path, such that modulators in some optical signals paths may have associated $V_\pi$ values that are greater than $V_\pi$ values associated with modulators in other optical paths. In that case, circuitry provided on the PIC for driving the modulators may not be able to supply the entire range of $V_\pi$ values.

Thus, there is a need for a PIC having a plurality of driver circuits that supply substantially the same $V_\pi$ to corresponding MZ modulators or supply $V_\pi$ values that are less than a predetermined voltage. There is also a need to optimize the performance of each optical path.

SUMMARY

Consistent with the present disclosure, a photonic integrated circuit is provided that comprises a substrate and a plurality of lasers provided on the substrate. Each of the plurality of lasers outputs a corresponding one of a plurality of optical signals, each of the plurality of optical signals having a corresponding one of a plurality of wavelengths. The photonic integrated circuit also includes a plurality of modulators provided on the substrate. Each of the plurality of optical signals is transmitted through a corresponding one of the plurality of modulators in a propagation direction, and each of the plurality of modulators has a corresponding one of a plurality of lengths along the propagation direction. Each of the plurality of lengths is different from one another.

Consistent with a further aspect of the present disclosure, a photonic integrated circuit is provided that includes a substrate, and a plurality of lasers provided on the substrate. Each of the plurality of lasers outputs a corresponding one of a plurality of optical signals, and each of the plurality of optical signals has a corresponding one of a plurality of wavelengths. The photonic integrated circuit also includes a plurality of Mach-Zehnder (MZ) modulators provided on the substrate. Each of the plurality of MZ modulators has a corresponding one of a plurality of modulator arms and is configured to receive a corresponding one of the plurality of optical signals. Each of the plurality of modulator arms has a corresponding one of a plurality of lengths, each of which extending in the propagation direction. Each of the plurality of lengths is different from one another Additional objects and advantages will be set forth in part in the description which follows, and in part will be obvious from the description, or may be learned by practice of the subject disclosed herein. The objects and advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the disclosure and together with the description, serve to explain the principles of the invention.

BRIEF DESCRIPTION OF THE DRAWINGS

FIG. 1 illustrates a photonic integrated circuit consistent with an aspect of the present disclosure.

DESCRIPTION OF THE EMBODIMENTS

A photonic integrated circuit (PIC) having multiple Mach-Zehnder modulators (MZ), for example, with different lengths is provided, such that the performance of each optical path on the PIC is optimized.

Reference will now be made in detail to the present embodiments, examples of which are illustrated in the accompanying drawings. Wherever possible, the same reference numbers will be used throughout the drawings to refer to the same or like parts.

As noted above, photonic integrated circuits may include multiple optical paths, each including a laser that outputs light at a particular wavelength ($\lambda$), and a modulator for modulating such light. Various parameters associated with each optical path may be adjusted by varying the length of a MZ modulator provided in that path. For example, the length (L) of an MZ modulator, e.g., the length of the modulator arms may be changed so that the insertion loss associated with each modulator is substantially uniform across each optical path. In addition, the modulator lengths may be varied so that $V_\pi$, the bias point of the modulator, and/or the modulation bandwidth are also substantially uniform across each optical path. Alternatively, the lengths of the first and second modulators may be selected such that $V_\pi$ for each modulator is below a predetermined value, such as 3 V.

With respect to one example, in which $V_\pi$ is substantially equal for each modulator, it is noted that the π phase shift resulting from application of $V_\pi$ can be written in terms of an index change as follows:

$$\Delta\phi = \Delta\beta L = \frac{2\pi\Gamma\Delta n}{\lambda}L = \pi \quad \text{Equation (1)}$$

Here, $\Delta\phi$ is the phase change due to an applied voltage, $\Delta\beta$ is the resulting change in propagation constant of the fundamental mode of the waveguide, L is the length of the electrode over which the voltage is applied, $\lambda$ is the wavelength of light in free space, $\Gamma$ is the confinement factor or overlap of the mode to the high electric field region which experiences an index change in the waveguide, and finally, $\Delta n$ is the index change due to the high electric field created by the applied voltage. Solving for the index change, the voltage required to induce a π phase shift must induce the following magnitude of index change:

$$\Delta n = \frac{\lambda}{2L\Gamma}(\text{index change required for } V_\pi) \quad \text{Equation (2)}$$

The high electric field in the core of the waveguide causes an index change due to various effects, such as the linear electro-optic effect, whereby the refractive index changes linearly with applied voltage. The equation relating these two variables is as follows:

$$\Delta n_{linear} = \frac{n_0^3}{2}r_{41}E_{applied} = \frac{n_0^3}{2}r_{41}\frac{V_{applied}}{d} \quad \text{Equation (3)}$$

where $n_0$ is the nominal refractive index, d is the thickness of the waveguide core over which the high electric field is applied, and $r_{41}$ is the linear electro-optic coefficient, the value of which depends on the material used and the wavelength of light. Setting Equation (3) equal to the index change required to achieve a π phase shift, the following can be obtained:

$$\frac{n_0^3}{2}r_{41}\frac{V_\pi}{d} = \frac{\lambda}{2L\Gamma}$$

$$\rightarrow V_\pi = \frac{1}{L} \cdot d \frac{\lambda}{[n_0(\lambda)]^3 \cdot r_{41}(\lambda, \text{material}) \cdot \Gamma(\lambda)} \quad \text{Equation (4)}$$

Equation (4) for $V_\pi$ includes all dependencies on wavelength and material explicitly to emphasize that $V_\pi$ is a function of wavelength. For example, the index in III-V materials is known to be dispersive, leading to a dependence of both $n_0(\lambda)$ and $\Gamma(\lambda)$ on wavelength. The electro-optic coefficient itself also varies with wavelength and is a function of the materials used. So different materials can affect the value of $V_\pi$.

There is also a quadratic electro-optic effect where the index varies quadratically with applied voltage:

$$\Delta n_{quadratic} = \frac{n_0^3}{2}sE_{applied}^2 = \frac{n_0^3}{2}s\left[\frac{V_{applied}}{d}\right]^2 \quad \text{Equation (5)}$$

In this case, s refers to the quadratic electro-optic coefficient. Again setting this equal to the index change required to achieve a π phase shift, we can solve to obtain:

$$\frac{n_0^3}{2}s\left[\frac{V_\pi}{d}\right]^2 = \frac{\lambda}{2L\Gamma} \quad \text{Equation (6)}$$

$$\rightarrow V_\pi = d\sqrt{\frac{1}{L} \cdot \frac{\lambda}{[n_0(\lambda)]^3 \cdot s(\lambda, \lambda_{BG}, \text{material}) \cdot \Gamma(\lambda)}}$$

Again, the dependence on wavelength is written out explicitly. As generally understood, the quadratic electro-optic coefficient becomes large near the direct band gap, $\lambda_{BG}$, of III-V semiconductors. Thus, if the band gap of the semiconductor is varied, this will have an impact on $V_\pi$ in addition to the wavelength dependence already noted above.

In situations involving modulators made of III-V semiconductors, a combination of linear and quadratic electro-optic effects are present depending on the bandgap of the modulator material relative to the signal wavelength, and the real equation for $V_\pi$ is a combination of the above two forms. In connection with both linear and quadratic effects, however, $V_\pi$ has an inverse dependence on the length, L, of the electrode. As a result, variations due to wavelength and material band gap changes across an array of modulators can be compensated by appropriate adjustment of the modulator electrode length to achieve a constant $V_\pi$ for each modulator.

Although the above discussion focuses on electro-refraction effects, it is understood that a similar formulation may be obtained for changes in electro-absorption from one optical path or modulator to the next. Thus, by varying the lengths of the modulators, electro-absorption may be also equalized or balanced over the plurality of optical paths.

FIG. 1 illustrates a photonic integrated circuit (PIC) 200 consistent with an aspect of the present disclosure. PIC 200 includes a plurality of optical paths 197-1 to 197-*n* provided on substrate 130. Each optical path includes a corresponding one of a plurality of phase modulators, such as MZ modulators 112-1 to 112-*n*, and a corresponding one of lasers 110-1 to 110-*n*. Lasers 110-1 to 110-*n* output optical signals at wavelengths λ1 to λn, respectively. In one example, each of wavelengths λ1 to λn is spectrally separated from one another by a fixed amount, such as 200 GHz.

Each of MZ modulators 112-1 to 112-*n* receives an optical signal from a corresponding one of 110-1 to 110-*n*, which are preferably distributed feedback (DFB) lasers. Each MZ modulator 112-1 to 112-*n* includes a first arm and a second arm, both of which have a length that extends in an optical signal propagation direction indicated by arrows 18. Preferably, the length of each of MZ modulators 112-1 to 112-*n*, i.e., the length of each electrode 116, is different and selected so that each optical path 197-1 to 197-*n* has optimized performance, e.g., $V_\pi$ associated with each of modulators 112-1 to 112-*n* is substantially the same or less than a predetermined value. In one example, a common power supply 118 can be provided that generates a common voltage that is fed to each driver circuit 114-1 to 114-*n*.

Each of a plurality of data streams is supplied to a corresponding one of driver circuits 114-1 to 114-*n*, which, in turn, provide modulated drive signals to a corresponding one of electrode pairs 116-1 to 116-*n* (or one such electrode in each pair) associated with each MZ modulator 112-1 to 112-n. As noted above, when a drive signal has a value of $V_\pi$, the optical signal portions propagating in the arms of the MZ modulator are π out of phase, and appropriately modulated optical signals 117-1 to 117-n can be generated. The modulated signals may be modulated in accordance with a non-return-to-zero modulation format, a differential quadrature phase shift keying (DQPSK) modulation format, quadrature phase shift keying (QPSK), phase shift keying (PSK), amplitude shift keying (ASK), and return-to-zero DQPSK (RZ-DQPSK), among other modulation formats.

The modulated optical signals are then fed to a WDM multiplexer 120, such as an arrayed waveguide grating (AWG), which may also be provided on substrate 130, along with the lasers, driver circuits, electrodes and power supply discussed above. Multiplexer 120 may then combine the received optical signals 117-1 to 117-n onto a common output waveguide 122. Alternatively, WDM multiplexer 120 may be provided off substrate 130.

Consistent with the present disclosure, a longer wavelength signal may be modulated with a first MZ modulator having a length which is longer than a length of a second MZ modulator that modulates shorter wavelength signals. Thus, in the example, shown in FIG. 1, DFB 110-1 may output light having a relatively short wavelength to modulator 112-1 having a relatively short length. On the other hand, light output from laser 110-n may have a wavelength longer than the wavelength of light output from laser 110-1, and, therefore, modulator 112-n, which modulates the light output from laser 110-n, has a length longer than the length of modulator 112-1. Consistent with the present disclosure, however, an optimized $V_\pi$ may be applied to electrodes 116-1 and 116-n of modulators 112-1 and 112-n, respectively.

Other embodiments of the invention will be apparent to those skilled in the art from consideration of the specification and practice of the invention disclosed herein. For example, although the above-discussion focuses on MZ modulators, other phase modulators are contemplated. In addition, electro-absorption modulators are contemplated as well. It is intended that the specification and examples be considered as exemplary only, with a true scope and spirit of the invention being indicated by the following claims.

What is claimed is:

1. A photonic integrated circuit, comprising:
    a substrate;
    a plurality of lasers provided on the substrate, each of the plurality of lasers outputting a corresponding one of a plurality of optical signals, each of the plurality of optical signals having a corresponding one of a plurality of wavelengths; and
    a plurality of Mach-Zehnder (MZ) modulators provided on the substrate, each of the plurality of MZ modulators having a corresponding one of a plurality of modulator arms, each of the plurality of optical signals being supplied to a corresponding one of the plurality of MZ modulators over a corresponding one of a plurality of paths, each of the plurality of paths being spaced from one another, each of the plurality of MZ modulators being configured to supply a corresponding one of a plurality of modulated optical signals, light associated with each of the plurality of optical signals being transmitted through a corresponding one of the plurality of modulator arms in a propagation direction, each of the plurality of modulator arms having a corresponding one of a plurality of lengths along the propagation direction, each of the plurality of lengths being different from one another.

2. A photonic integrated circuit in accordance with claim 1, further including an optical combiner provided on the substrate, the optical combiner having a plurality of inputs and an output, each of the plurality of inputs being configured to receive a corresponding one of the plurality of modulated optical signals.

3. A photonic integrated circuit in accordance with claim 2, wherein the optical combiner includes an arrayed waveguide grating.

4. A photonic integrated circuit in accordance with claim 1, wherein each of the plurality of MZ modulators has an associated one of a plurality of $V_\pi$ values, each of the plurality of $V_\pi$ values being substantially the same.

5. A photonic integrated circuit in accordance with claim 1, wherein each of the plurality of MZ modulators has an associated one of a plurality of $V_\pi$ values, each of the plurality of $V_\pi$ values being less than 3 V.

6. A photonic integrated circuit in accordance with claim 1, wherein a first one of the plurality of optical signals is transmitted through a first one of the plurality of modulator arms and a second one of the plurality of optical signals is transmitted through a second one of the plurality of modulator arms, the first one of the plurality of optical signals having a first wavelength and the second one of the plurality of optical signals having a second wavelength less than the first wavelength, the first one of the plurality of modulator arms having a first one of the plurality of lengths and the second one of the plurality of modulator arms having a second one of the plurality of lengths, the first one of the plurality of lengths being greater than the second one of the plurality of lengths.

7. A photonic integrated circuit in accordance with claim 1, further including:
    a plurality of driver circuits provided on the substrate, each of which being associated with a corresponding one of the plurality of MZ modulators, each of the plurality of driver circuits supplying a corresponding one of a plurality of electrical signals, and each of the plurality of MZ modulators being configured to modulate a corresponding one of the plurality of optical signals in accordance with a respective one of the plurality of the plurality of electrical signals; and
    a power supply circuit configured to supply a voltage to each of the plurality of driver circuits.

8. A photonic integrated circuit in accordance with claim 1, wherein each of the plurality of lasers includes a distributed feedback (DFB) laser.

9. A photonic integrated circuit in accordance with claim 1, wherein the substrate includes indium phosphide.

10. A photonic integrated circuit in accordance with claim 1, wherein said each of the plurality of modulated optical signals conforms to a non-return-to-zero (NRZ) modulation format.

11. A photonic integrated circuit in accordance with claim 1, wherein said each of the plurality of modulated optical signals conforms to a differential quadrature phase shifted keying (DQPSK) modulation format.

12. A photonic integrated circuit in accordance with claim 1, further including:
    a plurality of driver circuits provided on the substrate, each of the plurality of driver circuits being associated with a corresponding one of the plurality of MZ modulators, each of the plurality of driver circuits supplying a corresponding one of a plurality of electrical signals, and the plurality of MZ modulators being configured to modulate the light associated with each of the plurality of optical signals in accordance with a respective one of the plurality of the plurality of electrical signals, wherein each of the plurality of driver circuits provides the same DC bias to each of the plurality of modulators.

13. A photonic integrated circuit in accordance with claim 12, further including a power supply circuit configured to supply the DC bias.

14. A photonic integrated circuit in accordance with claim 1, further including:

a plurality of driver circuits provided on the substrate, each of the plurality of driver circuits being associated with a corresponding one of the plurality of MZ modulators, each of the plurality of driver circuits supplying a corresponding one of a plurality of electrical signals, and each of the plurality of MZ modulators being configured to modulate a corresponding one of the plurality of optical signals in accordance with a respective one of the plurality of the plurality of electrical signals, each of the plurality of driver circuits receiving a corresponding one of a plurality of DC biases, each of the plurality of DC biases being different from one another.

\* \* \* \* \*